(12) United States Patent
Yae et al.

(10) Patent No.: US 8,722,196 B2
(45) Date of Patent: May 13, 2014

(54) COMPOSITE MATERIAL, METHOD OF PRODUCING THE SAME, AND APPARATUS FOR PRODUCING THE SAME

(75) Inventors: Shinji Yae, Akashi (JP); Tatsuya Hirano, Himeji (JP); Hitoshi Matsuda, Himeji (JP)

(73) Assignee: Japan Science and Technology Agency, Saitama (JP)

( * ) Notice: Subject to any disclaimer, the term of this patent is extended or adjusted under 35 U.S.C. 154(b) by 561 days.

(21) Appl. No.: 12/921,348

(22) PCT Filed: Mar. 2, 2009

(86) PCT No.: PCT/JP2009/053877
§ 371 (c)(1),
(2), (4) Date: Dec. 9, 2010

(87) PCT Pub. No.: WO2009/110431
PCT Pub. Date: Sep. 11, 2009

(65) Prior Publication Data
US 2011/0117373 A1      May 19, 2011

(30) Foreign Application Priority Data

Mar. 7, 2008  (JP) ................................. 2008-057865
Aug. 19, 2008 (JP) ................................. 2008-211238

(51) Int. Cl.
| B32B 3/00 | (2006.01) |
| B32B 3/06 | (2006.01) |
| B32B 3/26 | (2006.01) |
| B32B 5/22 | (2006.01) |
| B32B 9/06 | (2006.01) |
| B32B 15/04 | (2006.01) |

(52) U.S. Cl.
USPC ..................... 428/450; 428/304.4; 428/306.6; 428/314.8; 428/315.5; 428/315.7; 428/317.9; 428/320.2

(58) Field of Classification Search
USPC .......... 428/304.4, 306.6, 314.8, 315.5, 315.7, 428/320.2, 317.9, 450
See application file for complete search history.

(56) References Cited

U.S. PATENT DOCUMENTS

| 4,376,963 A | 3/1983 | Knoop et al. ................. 360/135 |
| 5,591,565 A | 1/1997 | Holdermann et al. ........ 430/314 |

(Continued)

FOREIGN PATENT DOCUMENTS

| JP | 57-105826 A | 1/1982 |
| JP | 60-004271 A | 1/1985 |

(Continued)

OTHER PUBLICATIONS

Asoh et al., "Effect of noble metal catalyst species on the morphology of macroporous silicon formed by metal assisted chemical etching", Electrochimica Acta, vol. 54, 2009, pp. 5142-5148.*

(Continued)

Primary Examiner — Jonathan Langman
(74) Attorney, Agent, or Firm — Seed IP Law Group PLLC

(57) ABSTRACT

Proposed are a composite material having a high adhesiveness, wherein non-penetrating pores that are formed in a silicone surface layer are filled up with a metal or the like without leaving any voids by using the plating technique and the silicone surface layer is coated with the metal or the like, and a method of producing the composite material. A composite material, which has a high adhesiveness between a second metal or an alloy of the second metal (106a, 106b) and a silicone surface, can be obtained by filling up non-penetrating pores that are formed in the surface of a silicone substrate (100) substantially with a second metal or an alloy of the second metal (106a) with the use of the autocatalytic electroless plating technique wherein a first metal located at the bottom of the non-penetrating pores as described above serves as the starting point, and coating the surface of the silicone substrate (100) with the second metal (106b).

17 Claims, 9 Drawing Sheets

(56) References Cited

U.S. PATENT DOCUMENTS

| | | | |
|---|---|---|---|
| 6,750,111 B2 | 6/2004 | Schrems | |
| 7,183,012 B2 | 2/2007 | Saito et al. | 428/831.2 |
| 7,718,254 B2 | 5/2010 | Matsumura et al. | |
| 2003/0186084 A1 | 10/2003 | Saito et al. | 428/694 R |
| 2004/0187975 A1 | 9/2004 | Suemasu et al. | |
| 2005/0062033 A1 | 3/2005 | Ichihara et al. | |
| 2005/0101153 A1 | 5/2005 | Matsumura et al. | 438/753 |
| 2006/0292294 A1 | 12/2006 | Klein et al. | |
| 2007/0232044 A1 | 10/2007 | Chowdhury et al. | |
| 2008/0090074 A1 | 4/2008 | Matsumura et al. | 428/338 |
| 2009/0156426 A1 | 6/2009 | Schiestel et al. | 506/11 |
| 2011/0117373 A1 | 5/2011 | Yae et al. | |
| 2011/0123813 A1 | 5/2011 | Yae et al. | |
| 2011/0151242 A1 | 6/2011 | Yae et al. | |
| 2012/0321798 A1 | 12/2012 | Yae et al. | |

FOREIGN PATENT DOCUMENTS

| | | |
|---|---|---|
| JP | 06-029246 A | 2/1994 |
| JP | 11-283829 A | 10/1999 |
| JP | 2001-115268 A | 4/2001 |
| JP | 2003-288712 A | 10/2003 |
| JP | 2004-071626 A | 3/2004 |
| JP | 2004-124235 | 4/2004 |
| JP | 2004-193337 A | 7/2004 |
| JP | 2004-237429 A | 8/2004 |
| JP | 2005-105409 A | 4/2005 |
| JP | 2005-139376 A | 6/2005 |
| JP | 2006-342402 A | 12/2006 |
| JP | 2007-119897 A | 5/2007 |
| JP | 2007-533983 A | 11/2007 |
| WO | WO 2005/105308 A1 | 11/2005 |
| WO | 2006/051727 | 5/2006 |
| WO | WO 2009/110428 A1 | 9/2009 |
| WO | WO 2009/110431 A1 | 9/2009 |
| WO | WO 2010/021166 A1 | 2/2010 |

OTHER PUBLICATIONS

Yae et al., "Metal Nanorod Production in Silicon Matrix by Electroless Process", Applied Surface Science, vol. 255, 2009, pp. 4670-4672.*

Kanungo et al., "Improved contacts on a porous silicon layer by electroless nickel plating and copper thickening," *Semicond. Sci. Technol.* 21:964-970, 2006.

Tsujino et al., "Helical Nanoholes Bored in Silicon by Wet Chemical Etching Using Platinum Nanoparticles as Catalyst," *Electrochemical and Solid-State Letters* 8(12):C193-C195, 2005.

Chinese Notification of Written Opinion on the First Examination, dated Feb. 21, 2012, for corresponding Chinese Patent Application No. 200980107159.0, 8 pages.

English Translation of Chinese Notification of Written Opinion on the First Examination, dated Feb. 21, 2012, for corresponding Chinese Patent Application No. 200980107159.0, 8 pages.

Communication pursuant to Rules 70(2) and 70a(2) EPC, dated Oct. 25, 2011, for corresponding European Patent Application No. 09717775.2, 1 page.

U.S. Office Action, issued Sep. 5, 2012, for U.S. Appl. No. 12/920,638, 10 pages.

Japanese Notice of Written Opinion on the First Examination, issued May 14, 2012, for Japanese Application No. 200980126613.7, 3 pages.

English translation of Japanese Notice of Written Opinion on the First Examination, issued Jun. 14, 2012, for Japanese Application No. 200980126613.7, 3 pages.

Japanese Patent Application No. 2010-501898, Japanese Office Action, Feb. 8, 2013 (with translation).

U.S. Appl. No. 12/920,638, Final Office Action, Jan. 24, 2013.

Ito et al., Nanohole Patterned Media, *FUJITSU* 58(1):90-98, Jan. 2007.

Tsujino et al, "Morphology of nanoholes formed in silicon by wet etching in solutions containing HF and $H_2O_2$ at different concentrations using silver nanoparticles as catalysts," *Electrochemica Acta* 53:28-34, 2007.

Yae et al., "Formation of porous silicon by metal particle enhanced chemical etching in HF solution and its application for efficient solar cells," *Electrochemistry Communications* 5:632-636, 2003.

English translation of Korean Office Action for corresponding Korean Application No. 10-2010-7022171, mailed Jun. 8, 2012, 4 pages.

Korean Office Action for corresponding Korean Application No. 10-2010-7022171, mailed Jun. 8, 2012, 3 pages.

Japanese Office Action for Japanese Application No. 2008-054506, dated Apr. 23, 2013, 2 pages.

English Translation of Japanese Office Action for Japanese Application No. 2008-054506, dated Apr. 23, 2013, 2 pages.

Office Action, dated Aug. 28, 2013, for corresponding Japanese Application No. 200980107159.0, 13 pages, (with English Translation).

Hirano et al., "Electroless Process for Producing Metal Filled Si Nanopores," ECS Meeting Abstracts MA Feb. 2008 134, 214th ECS Meeting, 2008.

U.S. Appl. No. 13/875,198, filed May 1, 2013.

U.S. Appl. No. 14/019,299, filed Sep. 5, 2013.

U.S. Office Action, issued Sep. 16, 2013, for U.S. Appl. No. 13/589,793, 22 pages.

Zschech et al., "High-temperature resistant, ordered gold nanoparticle arrays," *Nanotechnology* 17:2122-2126, 2006.

* cited by examiner

COMPOSITE MATERIAL, METHOD OF PRODUCING THE SAME, AND APPARATUS FOR PRODUCING THE SAME

TECHNICAL FIELD

The present invention relates to a composite material, a method of producing the same, and an apparatus for producing the same.

BACKGROUND ART

There have been conventionally studied surface treatment methods such as metal coating, nonmetal coating, and chemical conversion coating. So far, various functional composite materials have been created using a matrix of a metal provided on a surface thereof with a film of another metal.

Plating is one of typical examples of the several surface treatment methods. This plating technique is widely utilized in various industries. However, such a film of a metal or the like to be formed by plating as described above is not sufficiently adhesive to the matrix unless the matrix is appropriately selected. For example, silicon, which is most widely used in the fields of semiconductor, MEMS, and the like, is one of the matrices to be provided with a metal film by plating. However, as having been pointed out, silicon generally has poor adhesion with a plated metal (Patent Document 1, for example).

As one of techniques for improving adhesion of a metal film to silicon, there is disclosed a method of immersing a surface of polycrystalline silicon in a heated aqueous solution of sodium hydroxide (NaOH) to provide unevenness in order to improve adhesion of the surface with a plated metal film (see Patent Document 2). Also disclosed is a technique of forming a porous layer with use of a special substrate and filling pores in the porous layer with a plating material by displacement plating (Patent Document 3).

Non-Patent Document 1: K. Ito and one other, "Nanohole Patterned Media", Journal FUJITSU, Fujitsu Limited, January 2007, Vol. 58, No. 1, pp. 90-98

Non-Patent Document 2: S. Yae and four others, "Electrochemistry Communications", August 2003, Vol. 5, p. 632

Non-Patent Document 3: K. Tsujino and one other, "Electrochemica Acta", Nov. 20, 2007, Vol. 53, p. 28

Patent Document 1: Japanese Unexamined Patent Publication No. 2004-193337

Patent Document 2: Japanese Unexamined Patent Publication No. S60-4271

Patent Document 3: Japanese Unexamined Patent Publication No. 2006-342402

Patent Document 4: Japanese Unexamined Patent Publication No. S57-105826

Patent Document 5: Japanese Unexamined Patent Publication No. H11-283829

Patent Document 6: Japanese Unexamined Patent Publication No. 2003-288712

Patent Document 7: Japanese Unexamined Patent Publication No. 2004-237429

Patent Document 8: Japanese Unexamined Patent Publication No. 2005-139376

Patent Document 9: Japanese Unexamined Patent Publication No. 2007-533983

Patent Document 10: United States Unexamined Patent Publication No. 2005/0101153

DISCLOSURE OF THE INVENTION

Problems to be Solved by the Invention

As described above, there have been disclosed several techniques of forming a metal film on a silicon surface by plating. However, in such a case there a metal film or the like is formed entirely on a silicon surface by plating, insufficient elimination of the unevenness generates voids, which may deteriorate the adhesion as well as inhibit exertion of the functions of the composite material.

Further, for example, upon adoption of widely used electroplating, it is necessary to provide a power supply and electrodes, resulting in limited achievement of decrease in size of equipment and decrease in cost for the equipment. On the other hand, it is required to go through complex production steps in the technique of filling pores by conventional electroplating.

Solutions to the Problems

The present invention solves the several technical problems described above and significantly contributes to development of a functional material that has a film of a metal or the like laminated on a silicon surface regardless of crystallization of silicon such as single-crystalline silicon or polycrystalline silicon. The inventors initially had an idea that provision of so called an anchor structure at the interface between a plating material and a silicon surface is useful for improvement in adhesion of the plating material to the silicon surface. With regard to filling up pores provided in a silicon surface layer with a plating material, the inventors have studied intensively to find a method of securely filling up pores regardless of the sizes of the pores and covering the silicon surface at locations not provided with the pores. Generally, the smaller pores are, the more difficult it is to fill up such pores with a plating material without voids being left therein. In spite of this fact, the inventors have achieved the present invention by finding that bringing about and utilizing a certain special circumstance progress the step of filling up pores with a plating material with the bottoms thereof serving as starting points as well as the subsequent plating step even by electroless plating.

A composite material according to the present invention has non-penetrating pores formed in a silicon surface, wherein with a first metal located at bottoms of the non-penetrating pores serving as starting points, the non-penetrating pores are filled up substantially with a second metal or an alloy of the second metal by autocatalytic electroless plating, and the silicon surface is covered with the second metal or the alloy of the second metal.

In this composite material, the second metal or an alloy of the second metal (hereinafter in this paragraph, simply referred to as "the second metal or the like") is formed on the silicon surface by autocatalytic electroless plating. The second metal or the like thus serves as a catalytic agent and continuously stimulates reduction of the ions of the second metal or the like even after the second metal or the like covers the first metal. In this composite material, the non-penetrating pores are filled up with the second metal or the like with the first metal located at the bottoms of the pores serving as the starting points, so that less voids are left in the pores. As a result, the film of the second metal or the like, which is formed on the silicon surface other than inside the pores subsequently to the filling in the pores, is highly adhesive to the silicon surface due to the effect of precise filling in the pores.

A method of producing a composite material according to the present invention includes: a dispersion/allocation step of dispersing and allocating on a silicon surface a first metal into shapes of particles, islands, or films; a non-penetrating pore formation step of forming non-penetrating pores in the silicon surface by immersing the silicon surface in a second solution including fluoride ions; and a plating step of filling up the non-penetrating pores substantially with a second metal or an alloy of the second metal by autocatalytic electroless plating, by immersing in a third solution including ions of the second metal and a reducing agent, with the first metal located at bottoms of the non-penetrating pores serving as starting points, as well as covering the silicon surface with the second metal or the alloy of the second metal.

In this method of producing a composite material, the first metal is initially dispersed and allocated on the silicon surface into the shapes of particles, islands, or films. The silicon surface supporting the first metal is then immersed in the second solution including fluoride ions so as to form the pores in the silicon surface layer. In this case, the first metal in the shapes of particles, islands, or films is located at the bottoms of the finally formed non-penetrating pores as if the first metal has dug into the pores. Thereafter, the second metal or an alloy of the second metal (hereinafter in this paragraph, simply referred to as "the second metal or the like") is formed to fill the pores by autocatalytic electroless plating. The second metal or the like therefore serves as a catalytic agent and continuously stimulates reduction of the ions of the second metal or the like even after the second metal or the like covers the first metal. In this composite material, the second metal or the like fills the non-penetrating pores while the first metal located at the bottoms of the pores serving as the starting points, so that less voids are left in the pores. As a result, the film of the second metal or the like, which is formed on the silicon surface other than inside the pores subsequently to the filling in the pores, is highly adhesive to the silicon surface due to the effect of precise filling in the pores.

Another method of producing a composite material according to the present invention includes: a dispersion/allocation step of dispersing and allocating on a silicon surface a first metal into shapes of particles, islands, or films by immersing the silicon surface in a first solution including ions of the first metal and fluoride ions; a non-penetrating pore formation step of forming non-penetrating pores in the silicon surface by immersing the silicon surface in a second solution including fluoride ions; and a plating step of filling up the non-penetrating pores substantially with a second metal or an alloy of the second metal by autocatalytic electroless plating, by immersing in a third solution including ions of the second metal and a reducing agent, with the first metal located at bottoms of the non-penetrating pores serving as starting points, as well as covering the silicon surface with the second metal or the alloy of the second metal.

In this method of producing a composite material, the silicon surface is initially immersed in the first solution including ions of the first metal and fluoride ions, so that the first metal is dispersed and allocated on the silicon surface into the shapes of particles, islands, or films. The silicon surface supporting the first metal is then immersed in the second solution including fluoride ions so as to form the pores in the silicon surface layer. In this case, the first metal in the shapes of particles, islands, or films is located at the bottoms of the finally formed non-penetrating pores as if the first metal has dug into the pores. Thereafter, the second metal or an alloy of the second metal (hereinafter in this paragraph, simply referred to as "the second metal or the like") is formed to fill the pores by autocatalytic electroless plating. The second metal or the like therefore serves as a catalytic agent and continuously stimulates reduction of the ions of the second metal or the like even after the second metal or the like covers the first metal. In this composite material, the second metal or the like fills the non-penetrating pores while the first metal located at the bottoms of the pores serving as the starting points, so that less voids are left in the pores. As a result, the film of the second metal or the like, which is formed on the silicon surface other than inside the pores subsequently to the filling in the pores, is highly adhesive to the silicon surface due to the effect of precise filling in the pores.

An apparatus for producing a composite material according to the present invention includes: a dispersion/allocation device for dispersing and allocating on a silicon surface a first metal into shapes of particles, islands, or films; a non-penetrating pore forming device for forming non-penetrating pores in the silicon surface by immersing the silicon surface in a second solution including fluoride ions; and a plating device for filling up the non-penetrating pores substantially with a second metal or an alloy of the second metal by autocatalytic electroless plating, by immersing in a third solution including ions of the second metal and a reducing agent, with the first metal located at bottoms of the non-penetrating pores serving as starting points, as well as covering the silicon surface with the second metal or the alloy of the second metal.

In this apparatus for producing a composite material, the dispersion/allocation device for the first metal disperses and allocates the first metal on the silicon surface into the shapes of particles, islands, or films. There are then formed pores in the silicon surface layer with use of the device for immersing the silicon surface supporting the first metal in the second solution including fluoride ions. In this case, the first metal in the shapes of particles, islands, or films is located at the bottoms of the finally formed non-penetrating pores as if the first metal has dug into the pores. Thereafter, the second metal or an alloy of the second metal (hereinafter in this paragraph, simply referred to as "the second metal or the like") is formed by autocatalytic electroless plating with use of the device for filling the pores. The second metal or the like therefore serves as a catalytic agent and continuously stimulates reduction of the ions of the second metal or the like even after the second metal or the like covers the first metal. Accordingly, in the composite material produced by this apparatus, the second metal or the like fills the non-penetrating pores while the first metal located at the bottoms of the pores serving as the starting points, so that less voids are left in the pores. As a result, the film of the second metal or the like, which is formed on the silicon surface other than inside the pores subsequently to the filling in the pores, is highly adhesive to the silicon surface due to the effect of precise filling in the pores.

Another apparatus for producing a composite material according to the present invention includes: a dispersion/allocation device for dispersing and allocating on a silicon surface a first metal into shapes of particles, islands, or films by immersing the silicon surface in a first solution including ions of the first metal and fluoride ions; a non-penetrating pore forming device for forming non-penetrating pores in the silicon surface by immersing the silicon surface in a second solution including fluoride ions; and a plating device for filling up the non-penetrating pores substantially with a second metal or an alloy of the second metal by autocatalytic electroless plating, by immersing in a third solution including ions of the second metal and a reducing agent, with the first metal located at bottoms of the non-penetrating pores serving as starting points, as well as covering the silicon surface with the second metal or the alloy of the second metal.

In this apparatus for producing a composite material, with use of the device for immersing the silicon surface in the first solution including ions of the first metal and fluoride ions, the first metal is initially dispersed and allocated on the silicon surface into the shapes of particles, islands, or films. There are then formed pores in the silicon surface layer with use of the device for immersing the silicon surface supporting the first metal in the second solution including fluoride ions. In this case, the first metal in the shapes of particles, islands, or films is located at the bottoms of the finally formed non-penetrating pores as if the first metal has dug into the pores. Thereafter, the second metal or an alloy of the second metal (hereinafter in this paragraph, simply referred to as "the second metal or the like") is formed by autocatalytic electroless plating with use of the device for filling the pores. The second metal or the like therefore serves as a catalytic agent and continuously stimulates reduction of the ions of the second metal or the like even after the second metal or the like covers the first metal. Accordingly, in the composite material produced by this apparatus, the second metal or the like fills the non-penetrating pores while the first metal located at the bottoms of the pores serving as the starting points, so that less voids are left in the pores. As a result, the film of the second metal or the like, which is formed on the silicon surface other than inside the pores subsequently to the filling in the pores, is highly adhesive to the silicon surface due to the effect of precise filling in the pores.

It is quite interesting that the filling can be achieved with less voids being left, similarly to the above cases, even in a state where the non-penetrating pores provided in the silicon surface are very fine and a large number of such fine non-penetrating pores are formed. In other words, even with a porous silicon surface, the pores can be filled up with the second metal or an alloy of the second metal (hereinafter in this paragraph, simply referred to as "the second metal or the like") with a very high degree of accuracy, and the film or the layer of the second metal or the like can be formed also on the silicon surface other than inside the pores so as to be highly adhesive to the surface. Furthermore, it is regarded as significant that the composite material described above is formed in an electroless environment throughout the entire steps.

Effects of the Invention

With use of a composite material according to the present invention, a method of producing a composite material according to the present invention, or an apparatus for producing a composite material according to the present invention, non-penetrating pores formed in a silicon surface layer are filled up with a metal or an alloy of the metal with less voids being left. As a result, because of the advantageous effect of precise filling in the pores, it is possible to improve the adhesion between the silicon surface and a film or a layer of a second metal or an alloy of the second metal, which is formed on the silicon surface other than inside the pores subsequently to the filling in the pores.

BEST MODE FOR CARRYING OUT THE INVENTION

Figure 1:
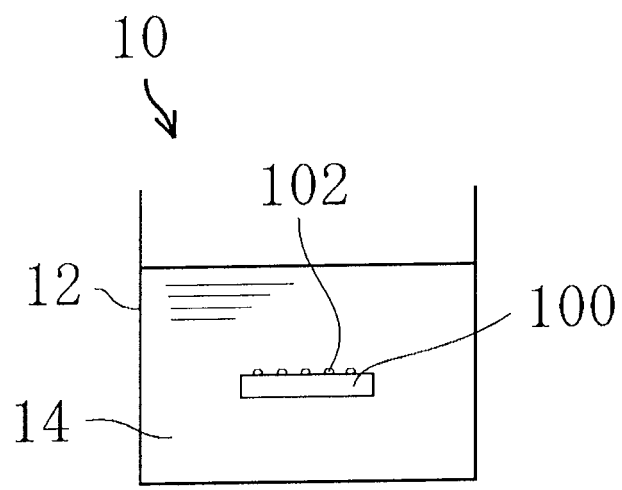
FIG. 1 is a diagram illustrating a dispersion/allocation device for dispersing and allocating first metal particles on a surface of a silicon substrate according to an embodiment of the present invention.

Embodiments of the present invention are described in detail with reference to the accompanying drawings. In the description, common parts are denoted by common reference symbols in all the drawings unless otherwise specified. Further, the elements in these embodiments are not necessarily illustrated in accordance with the same scale in the drawings. Some of the symbols may not be indicated in the drawings for the purpose of simplification in the appearances thereof.

First Embodiment

Figure 2:
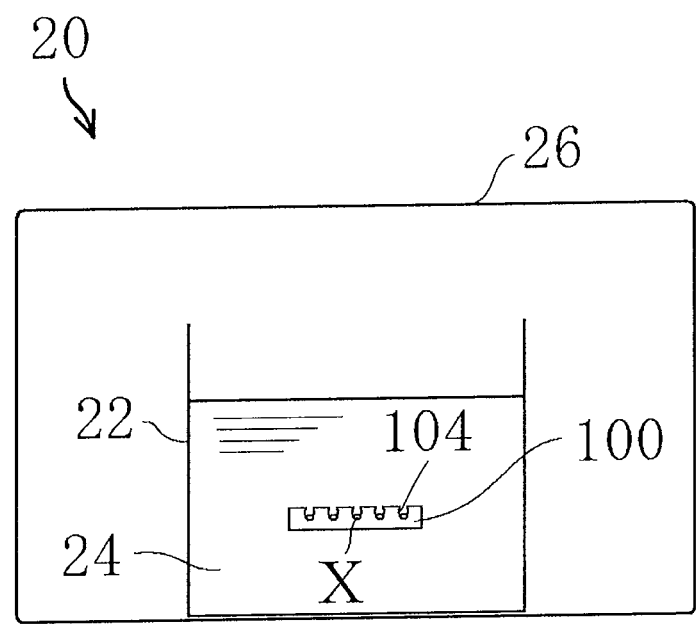
FIG. 2 is a diagram illustrating a non-penetrating pore forming device for forming non-penetrating pores in the surface of the silicon substrate according to the embodiment of the present invention.
Figure 3:
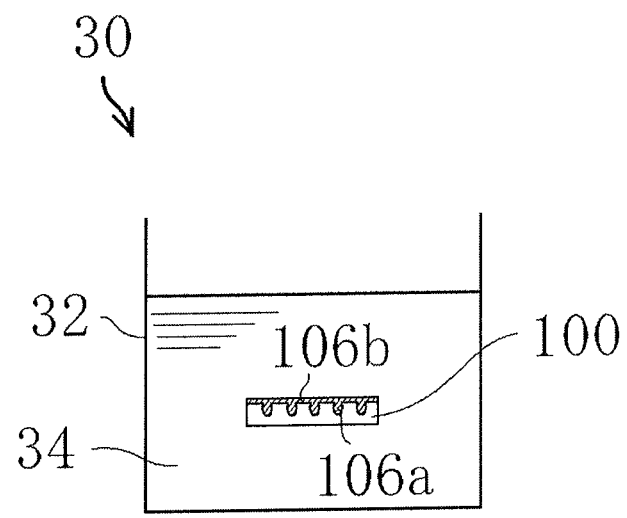
FIG. 3 is a diagram illustrating a plating device for plating a second metal or an alloy of the second metal according to the embodiment of the present invention.

Described in the present embodiment are a composite material and a method of producing the same. FIG. 1 is a diagram illustrating a dispersion/allocation device 10 for dispersing and allocating a first metal on a surface of a silicon substrate 100, which serves as a matrix, according to the present embodiment. FIG. 2 is a diagram illustrating a non-penetrating pore forming device 20 for forming non-penetrating pores in the surface of the silicon substrate 100. FIG. 3 is a diagram illustrating a plating device 30 for filling in the non-penetrating pores a second metal or an alloy of the second metal and forming on the surface of the silicon substrate 100 a film or a layer of the second metal or an alloy of the second metal (hereinafter, selectively referred to as a "layer" for the purpose of easier description). The present embodiment adopts silver (Ag) as the first metal and cobalt (Co) as the second metal or an alloy of the second metal.

Figure 4:
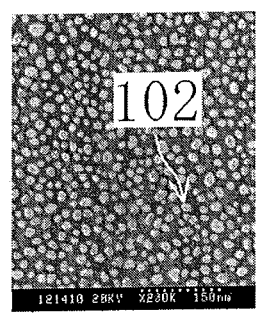
FIG. 4 is a SEM picture showing dispersion/allocation of the first metal particles on the surface of the silicon substrate according to the embodiment of the present invention.

As shown in FIG. 1, in the present embodiment, a silicon substrate 100 is initially immersed for 30 seconds in an aqueous solution (hereinafter, also referred to as a first solution) 14 that is contained in a reservoir 12 and is preliminarily conditioned to 5° C. This aqueous solution 14 includes silver nitrate ($AgNO_3$) of a molarity equal to 1 mmol/L (millimole/liter) and hydrofluoric acid (HF) of a molarity equal to 150 mmol/L. Observed as a result was that particles of silver (Ag) as a first metal 102 of diameters from 7 nm to 30 nm were deposited substantially uniformly on the surface of the silicon substrate 100 at a particle density of approximately $1.8 \times 10^{11}$ particles/$cm^2$. FIG. 4 is a picture taken with use of a scanning electron microscope (hereinafter, referred to as a SEM), which shows the surface of the silicon substrate 100 in this case. The silicon substrate 100 in the present embodiment is of a p-type. Although not illustrated for the purpose of simplification of the appearance of the figure, the silicon substrate 100 is immersed while being partially covered with and retained by a holder that is made of a known fluorocarbon resin. Such a holder for the silicon substrate 100 is not shown in FIGS. 2 and 3 to be referred to later. The first metal 102 in the present embodiment is dispersed and allocated into the shapes of particles or islands when the silicon substrate is immersed in the first solution 14. However, in the present embodiment, such shapes are selectively referred to as "particles" for the purpose of easier description.

Figure 5:
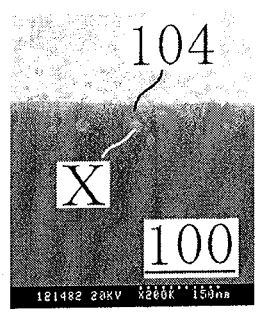
FIG. 5 is a cross sectional SEM picture showing the non-penetrating pores and the fine particles located at the bottoms thereof according to the embodiment of the present invention.

Subsequently, as shown in FIG. 2, in a dark room 26, the silicon substrate 100 supporting the particles of silver as the first metal 102 is immersed for approximately 10 minutes in hydrofluoric acid (hereinafter, also referred to as a second solution) 24 that has a molarity of 7.3 mol/L (mole/liter) and is contained in a reservoir 22. Observed as a result were a large number of fine non-penetrating pores 104 that were formed in the surface of the silicon substrate 100. It is quite interesting that the non-penetrating pores 104 were provided with fine particles X at the bottoms thereof. FIG. 5 is a cross sectional SEM picture showing the non-penetrating pores 104 and the fine particles X located at the bottoms thereof. This SEM picture indicates that the non-penetrating pores 104 have diameters of several nm to several tens of nm. Therefore, the diameters of the non-penetrating pores 104 well correspond to the diameters of the particles of silver as the first metal 102, which are dispersed and allocated on the surface of the silicon substrate 100.

As described above, hydrofluoric acid is adopted as the second solution 24, which includes no fine particle other than those of silver. It is thus determined in the present embodiment that the fine particles X are particles of silver as the first metal 102 which are formed on the silicon surface with use of the first solution 14. Further, the SEM picture of FIG. 5 shows that the non-penetrating pores 104 are approximately 50 nm deep in average.

Figure 6:
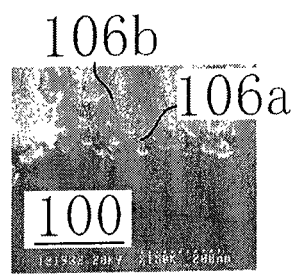
FIG. 6 is a cross sectional SEM picture showing the surface of the silicon substrate and the vicinity thereof, which has been immersed in a third solution, according to the embodiment of the present invention.

Thereafter, as shown in FIG. 3, the silicon substrate 100 provided with the non-penetrating pores 104 described above is immersed in an aqueous solution (hereinafter, also referred to as a third solution) 34 that serves as a plating solution and includes a metal salt of cobalt sulfate ($CoSO_4$) and a reducing agent of dimethylamine-borane (DMAB). In the present embodiment, the silicon substrate 100 was immersed in the third solution 34 for 120 seconds in an electroless environment. FIG. 6 is a cross sectional SEM picture showing the surface of the silicon substrate 100 and the vicinity thereof, which has been immersed in the third solution 34 for 120 seconds. Observed is that the non-penetrating pores 104, which were formed with use of the second solution 24, are filled up substantially with cobalt (Co) serving as a second metal 106a (hereinafter, also referred to as cobalt simply) without voids being left.

As shown in FIG. 6, a second metal 106b of cobalt (Co) is provided on the surface of the silicon substrate 100 other than inside the non-penetrating pores 104. The silicon substrate 100 is thus covered with a layer of cobalt (Co) as the second metal 106b by adopting the plating method described above. In the present embodiment, it is substantially cobalt that fills the non-penetrating pores 104, while, quite precisely, it is regarded as a cobalt-boron alloy (Co—B) including boron at approximately 0% to 0.2% in the atomic percentage (atom %).

In the present embodiment, the second metal 106a of cobalt (Co) fills the non-penetrating pores 104 without voids being left by autocatalytic electroless plating, with particles of silver as the first metal 102 located at the bottoms of the non-penetrating pores 104 serving as the starting points. More specifically, even after the silver particles, which initially served as a catalytic agent, are covered with the plating material of cobalt (Co), this cobalt (Co) itself still serves as the catalytic agent to continuously deposit cobalt (Co). Furthermore, such autocatalyticity is continuously effective even after the non-penetrating pores 104 have been filled, so that the surface of the silicon substrate 100 other than inside the non-penetrating pores 104 is covered with the second metal 106b of cobalt (Co). The autocatalytic electroless plating sets as the starting points the particles of the first metal 102 located at the bottoms of the non-penetrating pores 104 upon plating with use of the second metal (or an alloy of the second metal). Therefore, even in a case where a large number of non-penetrating pores are formed, the pores can be filled accurately with less voids being left. As a result, the second metal 106a of cobalt (Co), which fills the non-penetrating pores 104 with a high degree of accuracy, serves as an anchor. There is thus formed a layer of cobalt (Co) serving as the second metals 106a and 106b, which are highly adhesive to the surface of the silicon substrate 100. The layer of the second metal 106b was approximately 250 nm thick in this composite material. The thickness of this layer is obtained in accordance with the gravimetric technique. This technique is applied to obtain the thicknesses of all the layers of the second metals or alloys of the second metals to be described in the following embodiments.

Then tested was the qualitative adhesion of the composite material according to the present embodiment, in a method in compliance with JIS H8504 methods of adhesion test for metallic coatings. In this case, used on the composite material was a highly adhesive tape (Model 859T manufactured by Sumitomo 3M Limited) in place of the JIS Z1522 adhesive cellophane tape (equivalent to the tape (Model CT-18) manufactured by Nichiban Co., Ltd.). This highly adhesive tape is experimentally verified to have an adhesibility of 1317 J/$m^2$ or more.

The adhesion test resulted in no detachment observed in the composite material according to the present embodiment. Accordingly found out in the present embodiment was that the layer of cobalt (Co) (or the layer of the cobalt-boron alloy (Co—B)) had an adhesibility higher than 1317 J/$m^2$. In other words, the composite material of the present embodiment was found to have a significantly high adhesibility.

Subsequently measured was the adhesibility between the surface of the silicon substrate 100 and the layer of cobalt as the second metal 106b (Co), which was formed in a method including some step different from that of the present embodiment. Specifically, measurement was made, with use of an adhesibility measurement device 40 shown in FIG. 13, on a measurement sample that was obtained through the steps same as those of the present embodiment except the fact that the sample was immersed in the third solution 34 for 600 seconds. The measurement sample had a layer of the second metal of approximately 730 nm.

Figure 13:
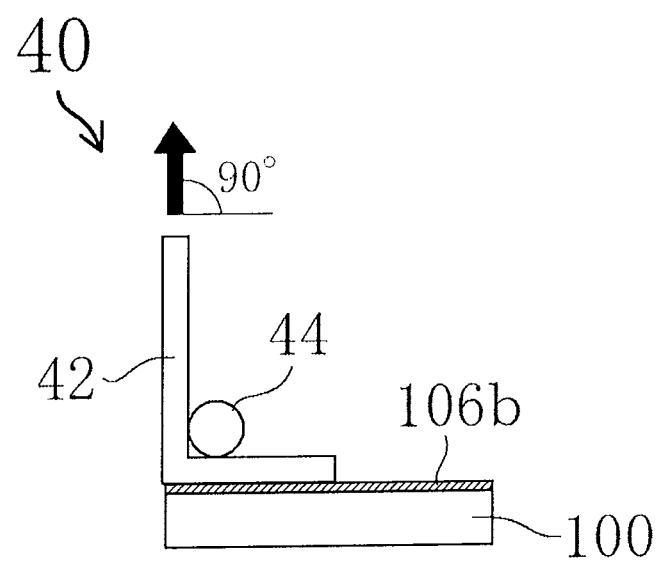
FIG. 13 is a schematic diagram of an adhesibility measurement device for a plating material according to an embodiment of the present invention.

The measurement was made in the following steps. Firstly, a tape (Model CT-18 manufactured by Nichiban Co., Ltd.) 42 is partially attached to the measurement sample. Subsequently, as shown in FIG. 13, one end of the tape 42 pressed by a presser 44 is caught by the adhesibility measurement device 40, and the tape 42 is pulled at a constant velocity vertically upward with respect to the surface of the layer of the second metal 106b. The adhesibility was measured during the upward pulling operation by reading a force applied to the tape 42 with use of a digital force gauge (DPS-5R manufactured by Imada Co., Ltd.).

It was found as a result that the adhesibility was higher than 426 J/m². As a comparative example, 203 J/m² was obtained as the adhesibility of a cobalt (Co) layer on a silicon substrate 100, while the layer is approximately as thick as that of the measurement sample and is not processed through the non-penetrating pore formation step and the cobalt (Co) filling step. The composite material of the present embodiment was therefore found out to have an adhesibility at least twice as high as that of the comparative example.

Moreover, all the steps shown in FIGS. 1 to 3 described above are performed in an electroless environment in the present embodiment. Therefore, the present embodiment is significantly advantageous also in view of cost therefor by applying plating of high mass productivity with use of a matrix of high versatility as well as by requiring no equipment such as electrodes, a power supply, and the like, which are necessary in electroplating.

Second Embodiment

Described in the present embodiment are another composite material and a method of producing the same. The method of producing the composite material according to the present embodiment is same as that of the first embodiment except for some conditions. Therefore, the description redundant with that of the first embodiment may not be repeatedly provided. A first metal 102 in the present embodiment is dispersed and allocated into the shapes of particles or islands when a silicon substrate is immersed in a first solution 14. However, in the present embodiment, such shapes are selectively referred to as "particles" for the purpose of easier description.

In the present embodiment, particles of silver (Ag) as the first metal 102 were dispersed and allocated on the surface of a silicon substrate 100, which serves as a matrix, with use of a dispersion/allocation device 10 configured as shown in FIG. 1. More specifically, the present embodiment adopts as the first solution 14 an aqueous solution that is preliminarily conditioned to 5° C. and includes silver nitrate ($AgNO_3$) of a molarity equal to 1 mmol/L (millimole/liter) and hydrofluoric acid (I-IF) of a molarity equal to 150 mmol/L.

Subsequently, the silicon substrate 100 supporting the silver (Ag) particles is immersed in a second solution 24 same as that of the first embodiment. In the present embodiment, the period of immersion was 15 minutes. Observed as a result were a large number of fine non-penetrating pores that were formed in the surface of the silicon substrate 100. Again in the present embodiment, the non-penetrating pores were provided at the bottoms thereof with fine particles, which were assumed to be of silver (Ag) described above. The non-penetrating pores in the present embodiment were approximately 100 nm deep in average with a maximum depth of approximately 180 nm.

Thereafter, the silicon substrate 100 provided with the non-penetrating pores described above is immersed in a third solution 34 that serves as a plating solution and is heated to 70° C., including metal salts of cobalt sulfate ($CoSO_4$) and nickel sulfate ($NiSO_4$) as well as a reducing agent of dimethylamine-borane (DMAB). In the present embodiment, the silicon substrate 100 was immersed in the third solution 34 for 120 seconds in an electroless environment. Observed as a result were that the non-penetrating pores, which were formed with use of the second solution 24, were filled up with a cobalt-nickel-boron alloy (Co—Ni—B) without voids being left, and that the cobalt-nickel-boron alloy (Co—Ni—B) was formed also on the surface of the silicon substrate 100 other than inside the non-penetrating pores. In the present embodiment, there were included cobalt at approximately 90% in the percentage (% by weight), nickel at approximately 6% in the percentage (% by weight), and boron at approximately 4% in the percentage (% by weight).

Figure 7:
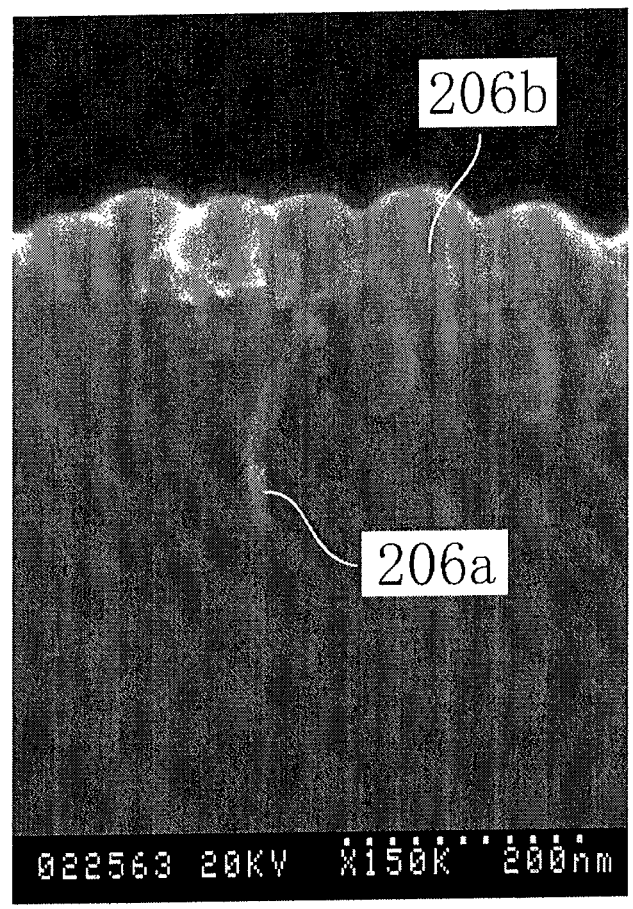
FIG. 7 is a cross sectional SEM picture of a composite material according to another embodiment of the present invention.

Again in the present embodiment, as described above, the cobalt-nickel-boron alloy (Co—Ni—B) as an alloy 206a of the second metal fills the non-penetrating pores without voids being left by autocatalytic electroless plating with fine particles of silver (Ag) as the first metal 102 located at the bottoms of the non-penetrating pores serving as the starting points. Furthermore, such autocatalyticity is continuously effective even after the non-penetrating pores have been filled, so that the surface of the silicon substrate 100 other than inside the non-penetrating pores is covered with a layer of the cobalt-nickel-boron alloy (Co—Ni—B). As a result, the cobalt-nickel-boron alloy (Co—Ni—B), which fills the non-penetrating pores 104 with a high degree of accuracy, serves as an anchor. There is thus formed the layer of the cobalt-nickel-boron alloy (Co—Ni—B) as the alloys 206a and 206b of the second metal, which are highly adhesive to the surface of the silicon substrate 100. FIG. 7 is a cross sectional SEM picture of the composite material, showing that the cobalt-nickel-boron alloy (Co—Ni—B) as the alloys 206a and 206b of the second metal fills the non-penetrating pores and also covers the silicon surface.

Measured in this case was the adhesibility between the surface of the silicon substrate 100 and the layer of the cobalt-nickel-boron alloy (Co—Ni—B), which was formed in a method including some step different from that of the present embodiment. Specifically, tested in a method in compliance with JIS H8504 methods of adhesion test for metallic coatings was the qualitative adhesion of a measurement sample that was obtained through the steps same as those of the present embodiment except the fact that the sample was immersed in the third solution 34 for 180 seconds. Namely, there was used the JIS Z1522 adhesive cellophane tape (equivalent to the tape (Model CT-18) manufactured by Nichiban Co., Ltd.).

As a result, the above measurement sample had no detachment observed. As a comparative example, a layer of a cobalt-nickel-boron alloy (Co—Ni—B) on a silicon substrate, which was not processed through the non-penetrating pore formation step and the cobalt-nickel-boron alloy (Co—Ni—B) filling step, was immersed in the third solution for 120 seconds to be naturally and gradually detached from the substrate. The present embodiment is found to realize formation with improved adhesion of the layer of the cobalt-nickel-boron alloy (Co—Ni—B), which could not be originally formed.

The adhesion was then tested in compliance with JIS H8504 methods of adhesion test for metallic coatings, with use of a highly adhesive tape (Model 859T manufactured by Sumitomo 3M Limited) in place of the JIS Z1522 adhesive cellophane tape. As a result, there was no detachment observed in the composite material according to the present embodiment. Accordingly found out was that the cobalt-nickel-boron alloy (Co—Ni—B) in the composite material of the present embodiment had an adhesibility higher than 1317 J/m². Therefore, extremely high adhesion was experimentally verified in the composite material of the present embodiment.

Moreover, similarly to the above embodiment, all the steps are performed in an electroless environment in the present embodiment, requiring no equipment such as electrodes, a power supply, and the like, which are necessary in electroplating. The autocatalytic electroless plating sets as the starting points the fine particles of the first metal located at the bottoms of the non-penetrating pores upon plating with use of the second metal. Therefore, even in a case where a large number of non-penetrating pores are formed, these pores can be filled accurately with less voids being left.

Third Embodiment

Described in the present embodiment are a different composite material and a method of producing the same. The method of producing the composite material according to the present embodiment is same as that of the first embodiment except for the matrix thereof. Therefore, the description redundant with that of the first embodiment may not be repeatedly provided. A first metal 302 in the present embodiment is dispersed and allocated into the shapes of particles or islands when the matrix is immersed in a first solution 14. However, in the present embodiment, such shapes are selectively referred to as "particles" for the purpose of easier description.

The present embodiment adopts a polycrystalline silicon substrate 300 as a matrix thereof. Again in the present embodiment, the first metal 302 of silver (Ag) was dispersed and allocated on the surface of the polycrystalline silicon substrate, which serves as the matrix, with use of a dispersion/allocation device 10 configured as shown in FIG. 1. More specifically, similarly to the first embodiment, the substrate is immersed for 30 seconds in a first solution 14 that is contained in a reservoir 12 and is preliminarily conditioned to 5° C. The first solution 14 includes silver nitrate (AgNO₃) of a molarity equal to 1 mmol/L (millimole/liter) and hydrofluoric acid (HF) of a molarity equal to 150 mmol/L. The polycrystalline silicon substrate 300 in the present embodiment is of an n-type.

Figure 8:
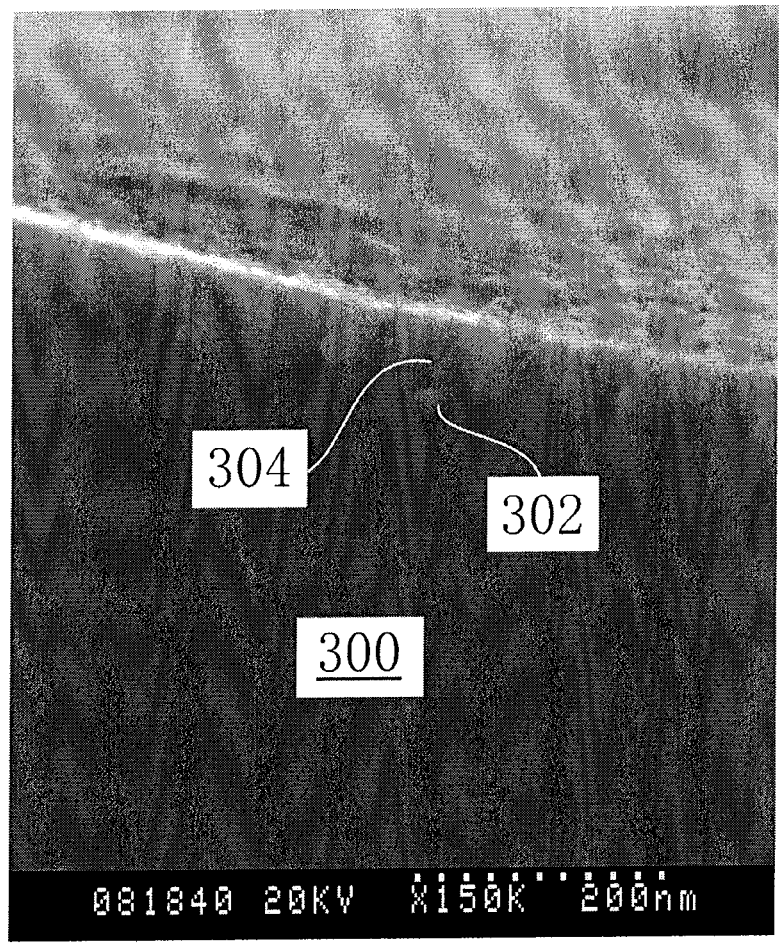
FIG. 8 is a cross sectional SEM picture showing non-penetrating pores and fine particles located at the bottoms thereof according to a different embodiment of the present invention.

Subsequently, with use of a non-penetrating pore forming device 20 configured as shown in FIG. 2, the polycrystalline silicon substrate 300 supporting the silver (Ag) particles is immersed in a second solution 24 same as that of the first embodiment. In the present embodiment, the period of immersion is 10 minutes. As shown in FIG. 8, observed as a result were a large number of fine non-penetrating pores 304 that are formed in the surface of the polycrystalline silicon substrate 300. Again in the present embodiment, the non-penetrating pores 304 were provided at the bottoms thereof with fine particles, which were assumed to be of silver (Ag) (the first metal 302) described above. The non-penetrating pores 304 in the present embodiment were approximately 40 nm deep in average with a maximum depth of approximately 120 nm.

Thereafter, with use of a plating device 30 shown in FIG. 3, an alloy of a second metal is formed on the polycrystalline silicon substrate 300. More specifically, the polycrystalline silicon substrate 300 provided with the non-penetrating pores 304 is immersed in a third solution 34 that serves as a plating solution and includes a metal salt of nickel sulfate (NiSO₄) and a reducing agent of dimethylamine-borane (DMAB). In the present embodiment, the polycrystalline silicon substrate 300 is immersed in the third solution 34 for 300 seconds in an electroless environment. Observed as a result were that the non-penetrating pores 304, which were formed with use of the second solution 24, were filled up with a nickel-boron alloy (Ni—B) as an alloy 306a of the second metal without voids being left, and that a layer of a nickel-boron alloy (Ni—B) 306b was formed also on the surface of the polycrystalline silicon substrate 300 other than inside the non-penetrating pores 304.

Figure 9:
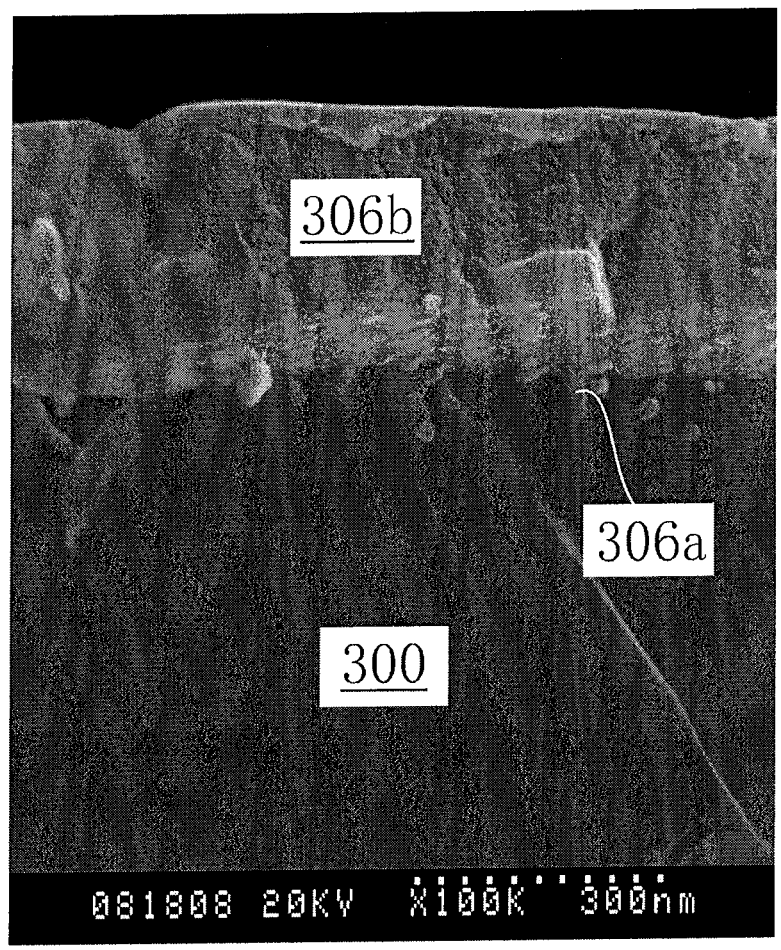
FIG. 9 is a cross sectional SEM picture of a composite material according to the different embodiment of the present invention.

Again in the present embodiment, as described above, the nickel-boron alloy (Ni—B) as the alloy 306a of the second metal fills the non-penetrating pores 304 without voids being left by autocatalytic electroless plating, with fine particles of silver (Ag) as the first metal 302 located at the bottoms of the non-penetrating pores 304 serving as the starting points. Furthermore, such autocatalyticity is continuously effective even after the non-penetrating pores 304 have been filled, so that the surface of the polycrystalline silicon substrate 300 other than inside the non-penetrating pores 304 is covered with the layer of the nickel-boron alloy (Ni—B) as the alloy 306b of the second metal. As a result, the nickel-boron alloy (Ni—B), which fills the non-penetrating pores 304 with a high degree of accuracy, serves as an anchor. There is thus formed the layer of the nickel-boron alloy (Ni—B) as the alloys 306a and 306b of the second metal, which are highly adhesive to the surface of the polycrystalline silicon substrate 300. FIG. 9 is a cross sectional SEM picture of the composite material, showing that the nickel-boron alloy (Ni—B) as the alloys 306a and 306b of the second metal fills the non-penetrating pores 304 and also covers the polycrystalline silicon surface.

Adoption of autocatalytic electroless plating allows plating of the second metal or an alloy thereof to proceed with the first metal located at the bottoms of the non-penetrating pores serving as the starting points. There is thus obtained a composite material provided with a layer of a second metal or an alloy of the second metal with less voids being left even in a case where a matrix is provided on the surface thereof with relatively large unevenness as in polycrystalline silicon.

Then measured was the adhesibility between the surface of the polycrystalline silicon substrate 300 as the matrix and the layer of the nickel-boron alloy (Ni—B) as the alloys 306a and 306b of the second metal in the composite material produced in the method according to the present embodiment. Specifically, tested in compliance with JIS H8504 methods of adhesion test for metallic coatings was the adhesion of a highly adhesive tape (Model 859T manufactured by Sumitomo 3M Limited) in place of the JIS Z1522 adhesive cellophane tape.

There was no detachment observed in the composite material according to the present embodiment. Accordingly found out was that the layer of the nickel-boron alloy (Ni—B) in the composite material of the present embodiment had an adhesibility higher than 1317 J/m². As a result, extremely high adhesion was experimentally verified in the composite material of the present embodiment. The layer of the nickel-boron alloy (Ni—B) was approximately 250 nm thick in this composite material.

While the present embodiment adopts the polycrystalline silicon substrate, the present invention is not limited such a case. For example, even in a case where there is adopted a substrate as a matrix which includes silicon oxide in a base and is provided with a layer of polycrystalline silicon formed by a known CVD method, a high adhesibility is obtained between the polycrystalline silicon layer and a second metal or an alloy of the second metal. Further, an effect substantially same as that of the present invention is exerted even in a case where the polycrystalline silicon layer is of a p-type.

Again in the present embodiment, all the steps shown in FIGS. 1 to 3 described above are performed in an electroless environment. Therefore, the present embodiment is significantly advantageous also in view of cost therefor by applying plating of high mass productivity with use of a matrix including polycrystalline silicon of high versatility as well as by requiring no equipment such as electrodes, a power supply, and the like, which are necessary in electroplating.

Fourth Embodiment

Described in the present embodiment are a different composite material and a method of producing the same. The method of producing the composite material according to the present embodiment is same as that of the first embodiment except for the matrix thereof. Therefore, the description redundant with that of the first embodiment may not be repeatedly provided. A first metal 402 in the present embodiment is dispersed and allocated into the shapes of particles or islands when the matrix is immersed in a first solution 14. However, in the present embodiment, such shapes are selectively referred to as "particles" for the purpose of easier description.

A matrix 400 in the present embodiment adopts a glassy carbon as a base which is provided on the surface thereof with hydrogenated microcrystalline silicon layers (lamination of an n-type microcrystalline silicon carbide (SiC) layer of 25 nm thick and an i-type microcrystalline silicon layer of 2 to 3 μm thick). Again in the present embodiment, the first metal 402 of silver (Ag) was dispersed and allocated on the surface of the matrix 400 with use of a dispersion/allocation device 10 configured as shown in FIG. 1. More specifically, similarly to the first embodiment, the matrix is immersed for 30 seconds in the first solution 14 that is contained in a reservoir 12 and is preliminarily conditioned to 5° C. The first solution 14 includes silver nitrate ($AgNO_3$) of a molarity equal to 1 mmol/L (millimole/liter) and hydrofluoric acid (HF) of a molarity equal to 150 mmol/L.

Figure 10:
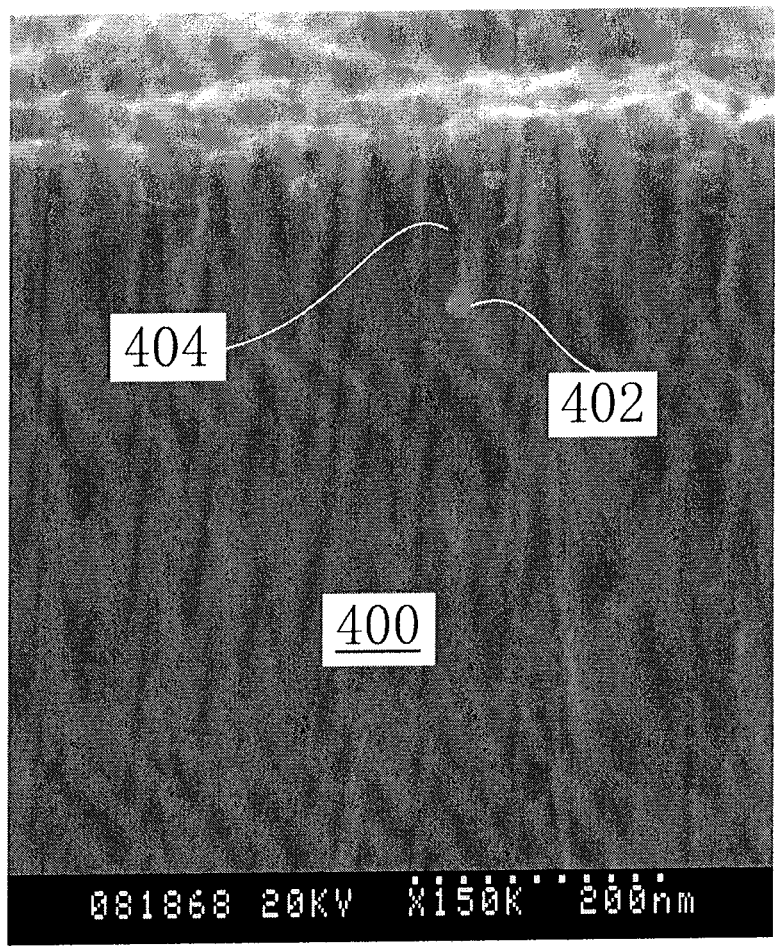
FIG. 10 is a cross sectional SEM picture showing non-penetrating pores and fine particles located at the bottoms thereof according to a different embodiment of the present invention.

Subsequently, with use of a non-penetrating pore forming device 20 configured as shown in FIG. 2, the matrix 400 supporting the silver (Ag) particles described above is immersed in a second solution 24 same as that of the first embodiment. In the present embodiment, the period of immersion is 10 minutes. As shown in FIG. 10, observed as a result were a large number of fine non-penetrating pores 404 that were formed in the surface of the matrix 400. Again in the present embodiment, the non-penetrating pores 404 were provided at the bottoms thereof with fine particles, which were assumed to be of silver (Ag) (the first metal 402) described above. The non-penetrating pores in the present embodiment were approximately 40 nm deep in average with a maximum depth of approximately 170 nm.

Thereafter, with use of a plating device 30 shown in FIG. 3, an alloy of a second metal is formed on the matrix 400. More specifically, the matrix 400 provided with the non-penetrating pores 404 is immersed in a third solution 34 that serves as a plating solution and includes a metal salt of nickel sulfate ($NiSO_4$) and a reducing agent of dimethylamine-borane (DMAB). In the present embodiment, the matrix 400 is immersed in the third solution 34 for 300 seconds in an electroless environment. Observed as a result were that the non-penetrating pores 404, which were formed with use of the second solution 24, were filled up with a nickel-boron alloy (Ni—B) as an alloy 406a of the second metal without voids being left, and that a layer of a nickel-boron alloy (Ni—B) 406b was formed also on the surface of the matrix 400 other than inside the non-penetrating pores 404.

Figure 11:
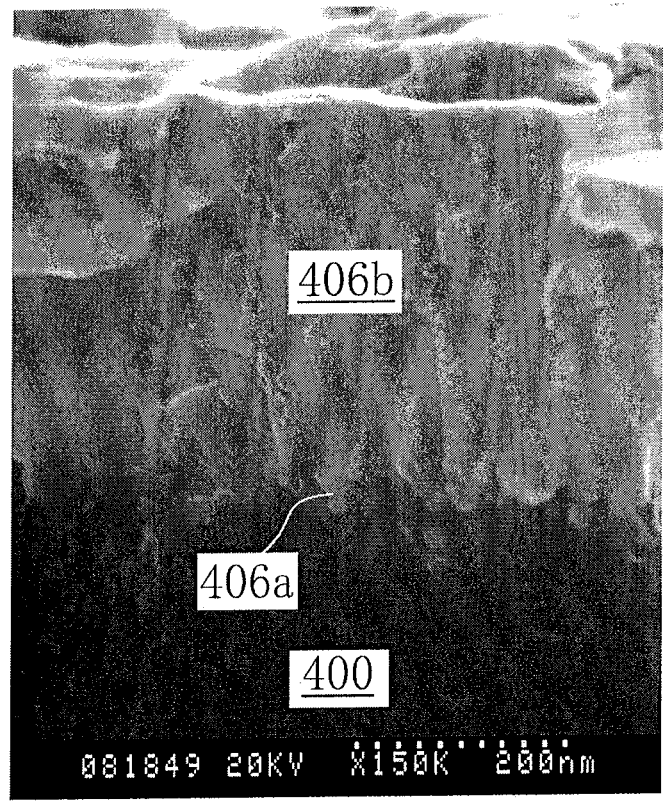
FIG. 11 is a cross sectional SEM picture of a composite material according to the different embodiment of the present invention.

Again in the present embodiment, as described above, the nickel-boron alloy (Ni—B) as the alloy 406a of the second metal fills the non-penetrating pores 404 without voids being left by autocatalytic electroless plating, with fine particles of silver (Ag) as the first metal 402 located at the bottoms of the non-penetrating pores 404 serving as the starting points. Furthermore, such autocatalyticity is continuously effective even after the non-penetrating pores 404 have been filled, so that the surface of the silicon substrate 400 other than inside the non-penetrating pores 404 is covered with the layer of the nickel-boron alloy (Ni—B) as the alloy 406b of the second metal. As a result, the nickel-boron alloy (Ni—B), which fills the non-penetrating pores 404 with a high degree of accuracy, serves as an anchor. There is thus formed the layer of the nickel-boron alloy (Ni—B) as the alloys 406a and 406b of the second metal, which are highly adhesive to the surface of the matrix 400. FIG. 11 is a cross sectional SEM picture of the composite material, showing that the nickel-boron alloy (Ni—B) as the alloys 406a and 406b of the second metal fills the non-penetrating pores 404 and also covers the microcrystalline silicon surface.

Adoption of autocatalytic electroless plating allows plating of the second metal or an alloy thereof to proceed with the first metal located at the bottoms of the non-penetrating pores serving as the starting points. There is thus obtained a composite material provided with a layer of the second metal or an alloy of the second metal with less voids being left even in a case where a matrix is provided on the surface thereof with relatively large unevenness as in microcrystalline silicon.

Then measured was the adhesibility between the microcrystalline silicon layer on the surface of the matrix 400 and the layer of the nickel-boron alloy (Ni—B) as the alloys 406a and 406b of the second metal in the composite material produced in the method according to the present embodiment. Specifically, tested in compliance with JIS H8504 methods of adhesion test for metallic coatings was the adhesion of a highly adhesive tape (Model 859T manufactured by Sumitomo 3M Limited) in place of the JIS Z1522 adhesive cellophane tape.

There was no detachment observed in the composite material according to the present embodiment. Accordingly found out was that the nickel-boron alloy (Ni—B) in the composite material of the present embodiment had an adhesibility higher than 1317 $J/m^2$. As a result, extremely high adhesion was experimentally verified in the composite material of the present embodiment.

Again in the present embodiment, all the steps shown in FIGS. 1 to 3 described above are performed in an electroless environment. Therefore, the present embodiment is significantly advantageous also in view of cost therefor by applying plating of high mass productivity with use of a matrix including microcrystalline silicon of high versatility as well as by requiring no equipment such as electrodes, a power supply, and the like, which are necessary in electroplating.

The embodiments described above respectively adopt, as the plating materials to be filled, cobalt (Co), the cobalt-boron alloy (Co—B), the cobalt-nickel-boron alloy (Co—Ni—B), and the nickel-boron alloy (Ni—B). However, the present invention is not limited such cases. For example, with use of a plating material of a cobalt-phosphorus alloy (Co—P), nickel-phosphorus alloy (Ni—P), or copper (Cu), a large number of fine non-penetrating pores can be filled by autocatalytic plating as in the respective embodiments described above. Further, there is exerted an effect substantially same as that of each of the above embodiments if adopted is a matrix provided with an uppermost layer that is made of single-crystalline silicon, polycrystalline silicon, or microcrystalline silicon and is thick enough to allow the non-penetrating pores to be formed therein. Even if there is adopted a matrix provided with an uppermost layer that is made of at least a material selected from a group consisting of single-crystalline silicon, polycrystalline silicon, or microcrystalline silicon, still exerted is an effect substantially same as that of each of the above embodiments.

Other Embodiment 1

Figure 12:
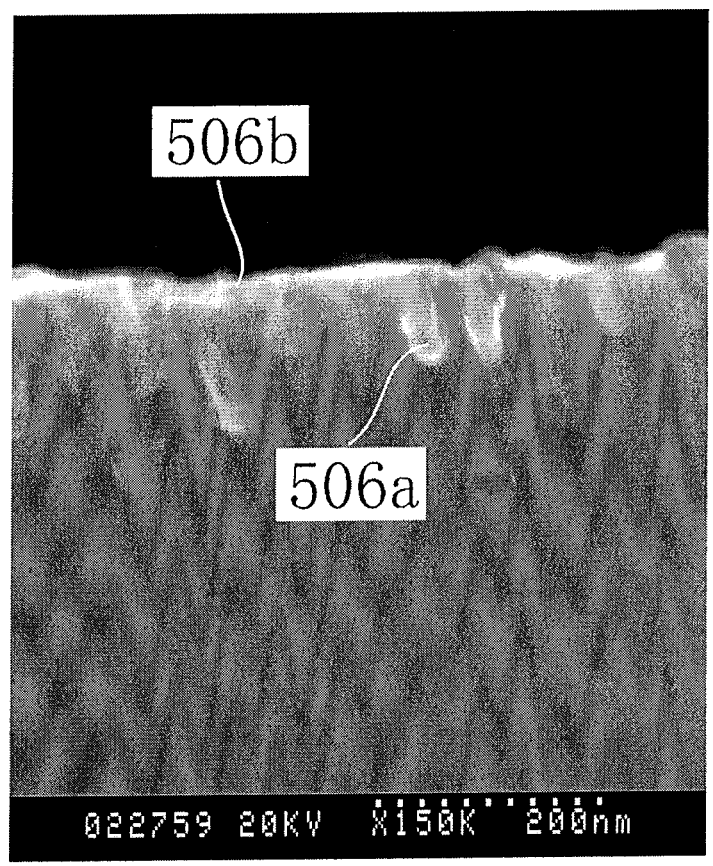
FIG. 12 is a cross sectional SEM picture of a composite material according to a different embodiment of the present invention.

In order to fill a nickel-boron alloy (Ni—B) as a plating material, the present embodiment initially adopts as a first solution an aqueous solution that includes silver nitrate ($AgNO_3$) of a molarity equal to 1 mmol/L (millimole/liter) and hydrofluoric acid (HF) of a molarity equal to 150 mmol/L. Subsequently, a silicon substrate 100 on which a first metal of silver (Ag) is dispersed and allocated is immersed in a second solution same as that of the first embodiment. There is then adopted, as a third solution, an aqueous solution that includes a metal salt of nickel sulfate and a reducing agent of dimethylamine-borane (DMAB). Non-penetrating pores provided in the silicon substrate 100 are filled up with a nickel-boron alloy (Ni—B) and the surface of the silicon substrate 100 other than inside the non-penetrating pores is covered with a layer of the nickel-boron alloy (Ni—B). FIG. 12 is a SEM picture showing that the non-penetrating pores and the silicon surface other than inside the non-penetrating pores are plated with the nickel-boron alloy (Ni—B) as alloys 506a and 506b of the second metal by immersion in the third solution for 180 seconds.

In this case, tested with use of a tape same as that of the first embodiment (Model CT-18 manufactured by Nichiban Co., Ltd.) was the adhesion of a measurement sample, which was obtained through the step same as that of forming a layer of the nickel-boron alloy (Ni—B) except the fact that the sample was immersed in the third solution for 360 seconds.

As a result, the above measurement sample had no detachment observed. As a comparative example, a layer of a nickel-boron alloy (Ni—B) formed on a silicon substrate 100, which was not processed through the non-penetrating pore formation step and the nickel-boron alloy (Ni—B) filling step, was immersed in the third solution 34 for 120 seconds and was naturally and gradually detached from the substrate. The present embodiment is found to realize formation with improved adhesion of the layer of the nickel-boron alloy (Ni—B), which could not be originally formed.

Tested in compliance with JIS H8504 methods of adhesion test for metallic coatings was the adhesion of the composite material in the present embodiment, with use of a highly adhesive tape (Model 859T manufactured by Sumitomo 3M Limited) in place of the JIS Z1522 adhesive cellophane tape.

As a result, there was no detachment observed in the composite material according to the present embodiment. Accordingly found out was that the layer of the nickel-boron alloy (Ni—B) had an adhesibility higher than 1317 $J/m^2$ in the composite material of the present embodiment. Extremely high adhesion was experimentally verified in the composite material of the present embodiment.

Each of the embodiments described above adopts the first solution including hydrofluoric acid (HF). However, the present invention is not limited to such a case. An effect substantially same as that of the present invention is exerted even in a case where ammonium fluoride ($NH_4F$), for example, is used in place of hydrofluoric acid (HF).

Moreover, each of the embodiments described above adopts silver (Ag) as the first metal. However, the present invention is not limited to such a case. Alternatively, the first metal may be palladium (Pd), gold (Au), platinum (Pt), or rhodium (Rh), for example. An effect substantially same as that of the present invention is exerted as long as the first metal is a catalytic agent that serves as the starting point to cause the second metal or an alloy of the second metal to be an autocatalytic plating material.

Other Embodiment 2

Described as an example is a case where gold (Au) is adopted as a first metal. A silicon substrate 100 was initially immersed for 10 seconds in an aqueous solution (a first solution) that was preliminarily conditioned to 5° C. This aqueous solution includes tetrachloroauric acid ($HAuCl_4$) of a molarity equal to 1 mmol/L (millimole/liter) and hydrofluoric acid (HF) of a molarity equal to 150 mmol/L. Subsequently, the silicon substrate 100 supporting gold fine particles was immersed for 15 minutes in a second solution same as that of the first embodiment. Thereafter, plating was performed with use of an aqueous solution as a plating solution that includes a metal salt of nickel sulfate ($NiSO_4$) and a reducing agent of dimethylamine-borane (DMAB). There was thus produced a measurement sample of the silicon substrate 100 that is provided with a layer of a nickel-boron alloy (Ni—B) with gold (Au) serving as the first metal.

An adhesion test same as that of the second embodiment was performed on this measurement sample that adopts gold (Au) as the first metal. As a result, there was observed no detachment of the plating layer. Therefore, the effect of the present embodiment was exerted even in a case where gold (Au) was adopted as the first metal.

Other Embodiment 3

Described below is a case where platinum (Pt) is adopted as a first metal. A silicon substrate 100 was initially immersed for 60 seconds in an aqueous solution (a first solution) that was preliminarily conditioned to 40° C. This aqueous solution includes hexachloroplatinic(IV) acid of a molarity equal to 1 mmol/L (millimole/liter) and hydrofluoric acid (HF) of a molarity equal to 150 mmol/L. Subsequently, the silicon substrate 100 supporting platinum fine particles was immersed for 60 minutes in a second solution same as that of the first embodiment. Thereafter, plating was performed with use of an aqueous solution as a plating solution that includes a metal salt of nickel sulfate ($NiSO_4$) and a reducing agent of dimethylamine-borane (DMAB). There was thus produced a measurement sample of the silicon substrate 100 that is provided with a layer of a nickel-boron alloy (Ni—B) with platinum (Pt) serving as the first metal.

Visually observed was the condition of the plating layer formed on the measurement sample that adopts platinum (Pt) as the first metal. Observed as a result was that the plating layer was formed uniformly on the silicon substrate 100 in the above measurement sample. As a comparative example, a layer of a nickel-boron alloy (Ni—B) formed on a silicon substrate 100, which was not processed through the non-penetrating pore formation step and the nickel-boron alloy (Ni—B) filling step, was immersed in the third solution to be naturally and gradually detached at some portions thereof. The present embodiment is found to realize formation of the layer of the nickel-boron alloy (Ni—B), which could not be originally formed. Consequently, the effect of the present invention is exerted even in a case where platinum (Pt) is adopted as the first metal.

Even in a case where the silicon is provided thereon with several kinds of metals selected from the metals referred to already, there is exerted an effect similar to that of the present invention. Although not noted in the above description of the respective embodiments, the first metal is not necessarily required to be a pure metal including no impurities in any one of the above embodiments. The effect of the present invention is substantially exerted even in a case where the first metal includes an impurity that is possibly included in ordinary cases. In each of the above embodiments, the silicon substrate is immersed in the first solution to support the fine particles of the first metal. However, the present invention is not limited to the above. For example, even in a case where a suspension including fine particles of the first metal is applied onto the silicon by known spin coating and is then dried, it is verified that this first metal serves substantially similarly to the first metal of any one of the above embodiments.

As already described, there is exerted an effect substantially similar to that of any one of the above embodiments as long as the matrix is provided with an uppermost layer that is made of single-crystalline silicon, polycrystalline silicon, or microcrystalline silicon and is thick enough to allow the non-penetrating pores to be formed therein. In addition, there is exerted an effect substantially similar to that of any one of the above embodiments even in a case where a matrix is provided with an uppermost layer that is made of at least a material selected from a group consisting of single-crystalline silicon, polycrystalline silicon, and microcrystalline silicon, in other words, a matrix is provided with an uppermost layer so as to configure a composite material. Furthermore, the effect of the present invention is exerted with a matrix provided independently with an amorphous silicon layer that is thick enough to allow the non-penetrating pores to be formed therein, or a matrix provided with an uppermost composite layer of any one of the above silicon materials and amorphous silicon.

Although not noted in the above description of the respective embodiments, the substance to fill the non-penetrating pores may include the second metal or an alloy of the second metal as well as an impurity, though slightly, such as carbon (C), oxygen (O), hydrogen (H), an additive like formalin or saccharin, which is included in a plating bath, or a decomposition product of any one of the substances described above.

In each of the above embodiments, a large number of first metal particles are dispersed and allocated on the surface of the silicon substrate, so that the non-penetrating pores provided in the silicon surface are porous. However, the present invention is not limited to such a case. As described above, the scope of claims is inclusive of modifications made within the scope of the present invention such as other combinations of the respective embodiments.

INDUSTRIAL APPLICABILITY

The present invention is widely applicable as a technical element for a functional composite material.

The invention claimed is:

1. A composite material having non-penetrating pores in a silicon surface, wherein:
the non-penetrating pores have a maximum depth of 180 nm;
a first metal is located at bottoms of the non-penetrating pores;
a second metal, or an alloy thereof, substantially fills the remaining volume of the non-penetrating pores;
the silicon surface is covered with the second metal or alloy thereof; and
the second metal is adhered to the silicon surface with an adhesibility such that the second metal cannot be detached from the silicon surface when tested according to Japanese Industrial Standard test H8504.

2. The composite material of claim 1, wherein:
the non-penetrating pores are formed in the silicon surface by immersing the silicon surface in a solution comprising fluoride ions, the silicon surface having the first metal dispersed thereon in the shapes of particles, islands, or films.

3. The composite material of claim 1, wherein:
the silicon surface is porous by provision of the non-penetrating pores.

4. The composite material of any one of claims 1 to 3, wherein:
the first metal comprises at least one metal selected from palladium (Pd), silver (Ag), gold (Au), platinum (Pt), and rhodium (Rh).

5. The composite material of claim 1, wherein:
the silicon comprises a material selected from single-crystalline silicon, polycrystalline silicon, microcrystalline silicon and amorphous silicon.

6. The composite material of claim 1, wherein the second metal is adhered to the silicon surface with an adhesibility of greater than 426 $J/m^2$.

7. The composite material of claim 1, wherein the second metal adheres to the silicon surface with an adhesibility of greater than 1317 $J/m^2$.

8. The composite material of claim 1, wherein the non-penetrating pores have a maximum depth of 170 nm.

9. The composite material of claim 1, wherein the non-penetrating pores have a maximum depth of 120 nm.

10. A composite material having non-penetrating pores in a silicon surface, wherein:
the non-penetrating pores have a maximum depth of 180 nm;
a first metal is located at bottoms of the non-penetrating pores;
a second metal, or an alloy thereof, substantially fills the remaining volume of the non-penetrating pores;
the silicon surface is covered with the second metal or alloy thereof; and
the second metal is adhered to the silicon surface with an adhesibility of greater than 426 $J/m^2$.

11. The composite material of claim 10, wherein the second metal adheres to the silicon surface with an adhesibility of greater than 1317 $J/m^2$.

12. The composite material of claim 10, wherein the non-penetrating pores have a maximum depth of 170 nm.

13. The composite material of claim 10, wherein the non-penetrating pores have a maximum depth of 120 nm.

14. The composite material of claim 10, wherein:
the non-penetrating pores are formed in the silicon surface by immersing the silicon surface in a solution comprising fluoride ions, the silicon surface having the first metal dispersed thereon in the shapes of particles, islands, or films.

15. The composite material of claim 10, wherein:
the silicon surface is porous by provision of the non-penetrating pores.

16. The composite material of claim 10, wherein:
the first metal comprises at least one metal selected from palladium (Pd), silver (Ag), gold (Au), platinum (Pt), and rhodium (Rh).
17. The composite material of claim 10, wherein:
the silicon comprises a material selected from single-crystalline silicon, polycrystalline silicon, microcrystalline silicon and amorphous silicon.

* * * * *

UNITED STATES PATENT AND TRADEMARK OFFICE
CERTIFICATE OF CORRECTION

PATENT NO. : 8,722,196 B2
APPLICATION NO. : 12/921348
DATED : May 13, 2014
INVENTOR(S) : Shinji Yae et al.

It is certified that error appears in the above-identified patent and that said Letters Patent is hereby corrected as shown below:

On the title page
Item (75):
"Shinji Yae, Akashi (JP); Tatsuya Hirano, Himeji (JP); Hitoshi Matsuda, Himeji (JP)" should read,
--Shinji Yae, Akashi-shi (JP); Tatsuya Hirano, Himeji-shi (JP); Hitoshi Matsuda, Himeji-shi (JP)--

Signed and Sealed this
Second Day of February, 2016

Michelle K. Lee
*Director of the United States Patent and Trademark Office*